(12) United States Patent
Dai et al.

(10) Patent No.: US 9,947,545 B2
(45) Date of Patent: *Apr. 17, 2018

(54) METHODS FOR GATE FORMATION IN CIRCUIT STRUCTURES

(71) Applicant: GLOBALFOUNDRIES Inc., Grand Cayman (KY)

(72) Inventors: Xintuo Dai, Clifton Park, NY (US); Jiong Li, Rexford, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 14 days.

This patent is subject to a terminal disclaimer.

(21) Appl. No.: 15/437,837

(22) Filed: Feb. 21, 2017

(65) Prior Publication Data

US 2017/0243748 A1    Aug. 24, 2017

Related U.S. Application Data

(63) Continuation of application No. 15/049,351, filed on Feb. 22, 2016, now Pat. No. 9,640,402.

(51) Int. Cl.
| H01L 21/336 | (2006.01) |
| H01L 21/283 | (2006.01) |
| H01L 21/308 | (2006.01) |
| H01L 21/306 | (2006.01) |

(52) U.S. Cl.
CPC ........ *H01L 21/283* (2013.01); *H01L 21/3081* (2013.01); *H01L 21/3085* (2013.01); *H01L 21/30604* (2013.01)

(58) Field of Classification Search
CPC ..................... H01L 21/283; H01L 21/30604
See application file for complete search history.

(56) References Cited

U.S. PATENT DOCUMENTS

| 9,640,402 B1 * | 5/2017 | Dai ................ H01L 21/28123 |
| 2005/0176193 A1 * | 8/2005 | Kang ............. H01L 21/28123 |
| | | 438/197 |
| 2011/0092039 A1 * | 4/2011 | Kim ................ H01L 29/66621 |
| | | 438/270 |
| 2011/0092093 A1 | 4/2011 | Kim et al. |

* cited by examiner

*Primary Examiner* — Jaehwan Oh
*Assistant Examiner* — Andre' C Stevenson
(74) *Attorney, Agent, or Firm* — Heslin Rothenberg Farley & Mesiti P.C.; Stephen Scuderi

(57) ABSTRACT

Methods for forming a gate structure of a circuit structure are provide. The methods for forming the gate structure may include: forming a first gate pattern in a gate mask layer, the forming including a first etching of rounded corner portions of the first gate pattern; forming a second gate pattern in the gate mask layer, the second gate pattern at least partially overlapping the first gate pattern, the forming including a second etching of rounded corner portions of the second gate pattern; and, etching the gate mask layer using the first gate pattern and second gate pattern to form the gate structure.

20 Claims, 19 Drawing Sheets

US 9,947,545 B2

METHODS FOR GATE FORMATION IN CIRCUIT STRUCTURES

CROSS REFERENCE TO RELATED APPLICATIONS

This application is a continuation application of U.S. patent application Ser. No. 15/049,351, filed Feb. 22, 2016, and entitled "METHODS FOR GATE FORMATION IN CIRCUIT STRUCTURES," the entirety of which is hereby incorporated herein by reference.

FIELD OF THE INVENTION

The present invention generally relates to fabricating circuit structures, and more specifically to formation of gate structures in circuit structures.

BACKGROUND

As circuit structure features have continued to shrink and become increasingly complex, circuit structure fabrication techniques have been continually modified to successfully form transistor features. Complex gate structures that span multiple fins, and have shapes more complex than simple rectangles, have generally been formed by single patterning processes at larger technology nodes. However, at current technology nodes of 10 nm or less, single patterning processes generally are not capable of accurately reproducing designed gate structures on a wafer, resulting in transistor structures that may not function properly.

SUMMARY OF THE INVENTION

Various shortcomings of the prior art are overcome, and additional advantages are provided through the provision, in one aspect, of a method including forming a gate structure of a circuit structure, the forming including: forming a first gate pattern in a gate mask layer, the forming including a first etching of rounded corner portions of the first gate pattern; forming a second gate pattern in the gate mask layer, the second gate pattern at least partially overlapping the first gate pattern, the forming including a second etching of rounded corner portions of the second gate pattern; etching the gate mask layer using the first gate pattern and second gate pattern to form the gate structure.

Additional features and advantages are realized through the techniques of the present invention. Other embodiments and aspects of the invention are described in detail herein and are considered a part of the claimed invention

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Reference is made below to the drawings, which are not drawn to scale for ease of understanding, wherein the same reference numbers used throughout different figures designate the same or similar components.

As circuit structure features have continued to shrink and become increasingly complex, circuit structure fabrication techniques have been continually modified to successfully form transistor features. Complex gate structures that span multiple fins, and have shapes more complex than simple rectangles, have generally been formed by single patterning processes at larger technology nodes. However, at technology nodes of 10 nm or less, single patterning processes are inadequate for forming complex gate structures. In general, complex gate structures will have one or more "inner corners," that is, corners where two rectangular blocks of different sizes are joined together. Due to various limitations of lithographic patterning techniques, such inner corners generally are not formed as sharp corners but instead are formed as rounded inner corners, having a corner rounding radius. The corner rounding radius r of an inner corner may be determined by determining the radius r of an imaginary circle that includes the arc of the rounded inner corner. At larger technology nodes, the corner rounding radius for an inner corner of a gate structure may be small enough relative to the size of the gate structure that the rounding does not significantly affect transistor functioning. At smaller nodes, such as 10 nm or lower, the inner corner rounding radius r should be about 30 nm or lower for proper transistor functioning, but single patterning processes generally cannot meet this target for inner corner rounding effects. A multiple patterning process for forming complex gate structures, in which portions of the gate structure are formed in two or more patterning steps and subsequently etched into a gate mask layer, may successfully pattern such complex gate structures at smaller technology nodes.

Figure 1:
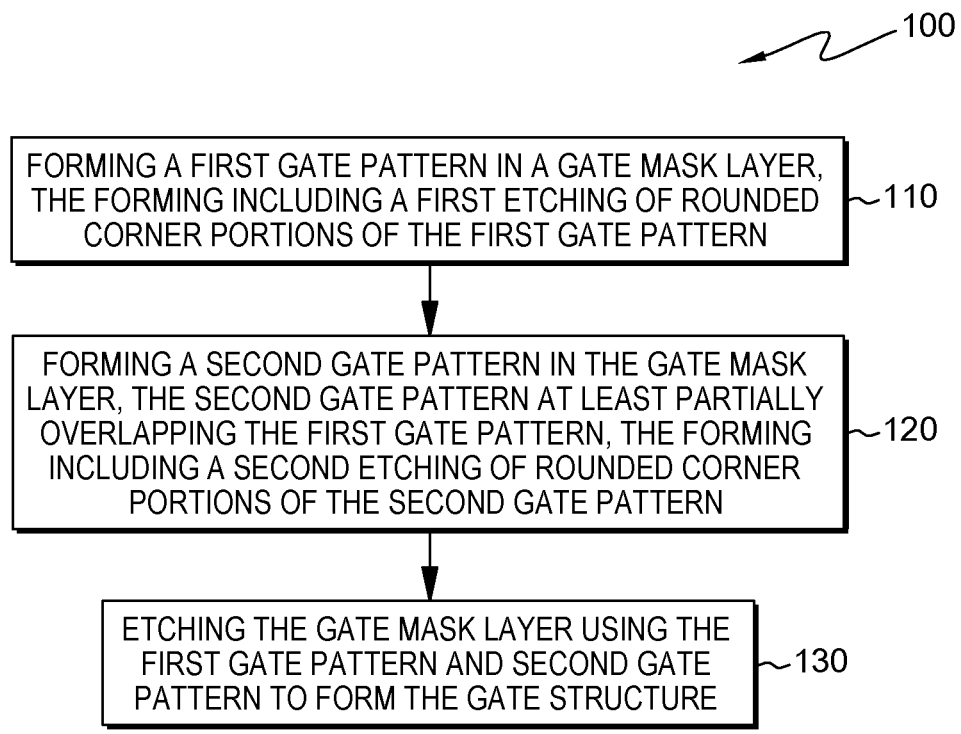
FIG. 1 is a block diagram depicting one embodiment of a process for forming a gate structure of a circuit structure, in accordance with one or more aspects of the present invention.

Thus, generally stated and as illustrated by the block diagram of FIG. 1, provided herein is a method 100 for forming a gate structure of a circuit structure. The method includes, at block 110, forming a first gate pattern in a gate mask layer, the forming including a first etching of rounded corner portions of the first gate pattern. At block 120, a second gate pattern is formed in the gate mask layer, the second gate pattern at least partially overlapping the first gate pattern, and the forming including a second etching of rounded corner portions of the second gate pattern. At block 130, the method includes etching the gate mask layer using the first gate pattern and second gate pattern to form the gate structure.

FIGS. 2A-2I depict one example of the process described above and depicted in the block diagram of FIG. 1. The resulting gate structure formed in the example of FIGS. 2A-2I is provided by way of example only, and it will be understood that many other gate structures may alternatively be formed by similar processes as those depicted in FIGS. 2A-2I.

Figure 2A:
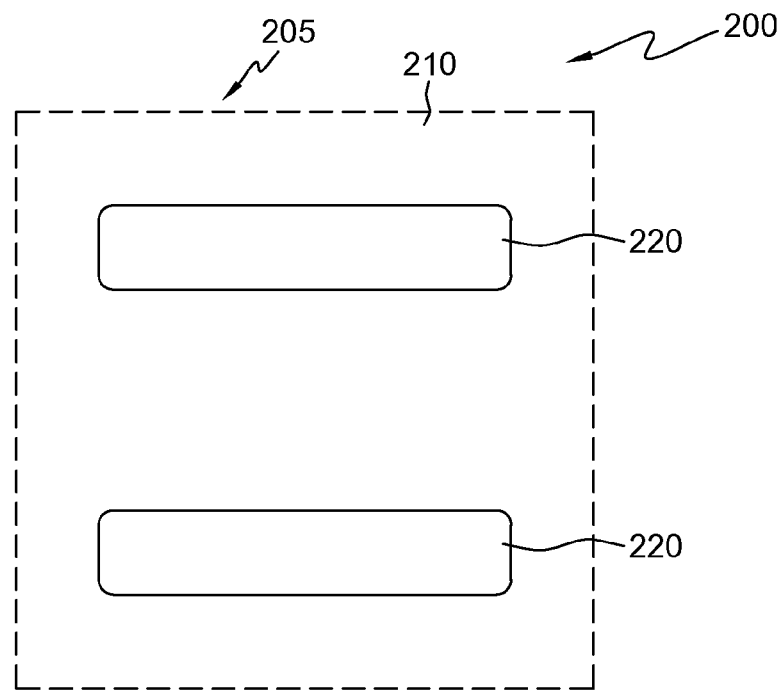
FIGS. 2A-2I depict one example of an embodiment of a process for forming a gate structure of a circuit structure, in accordance with one or more aspects of the present invention.
Figure 2B:
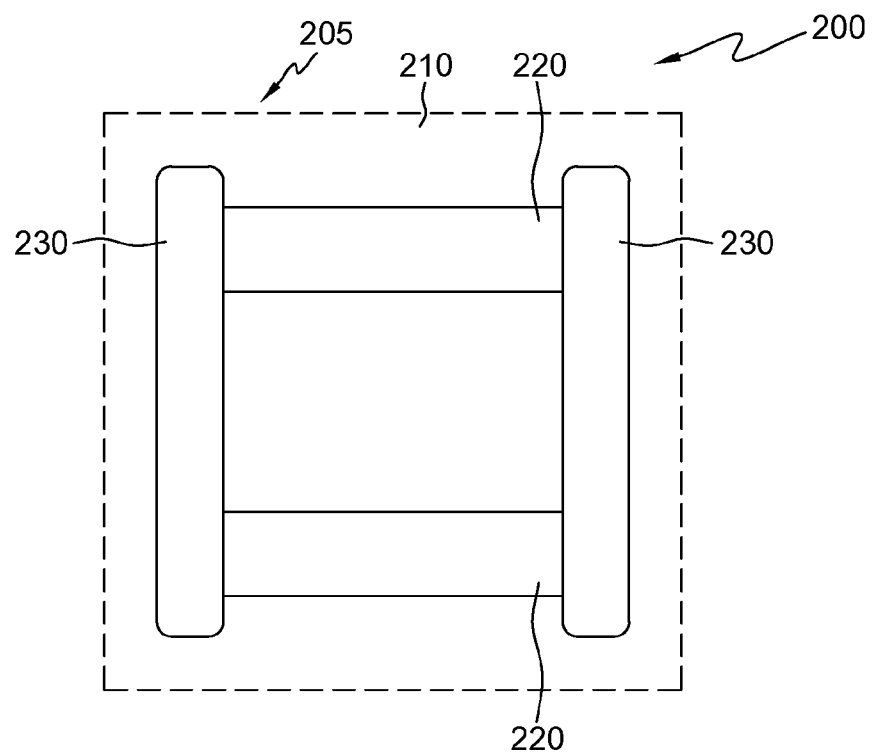
Figure 2C:
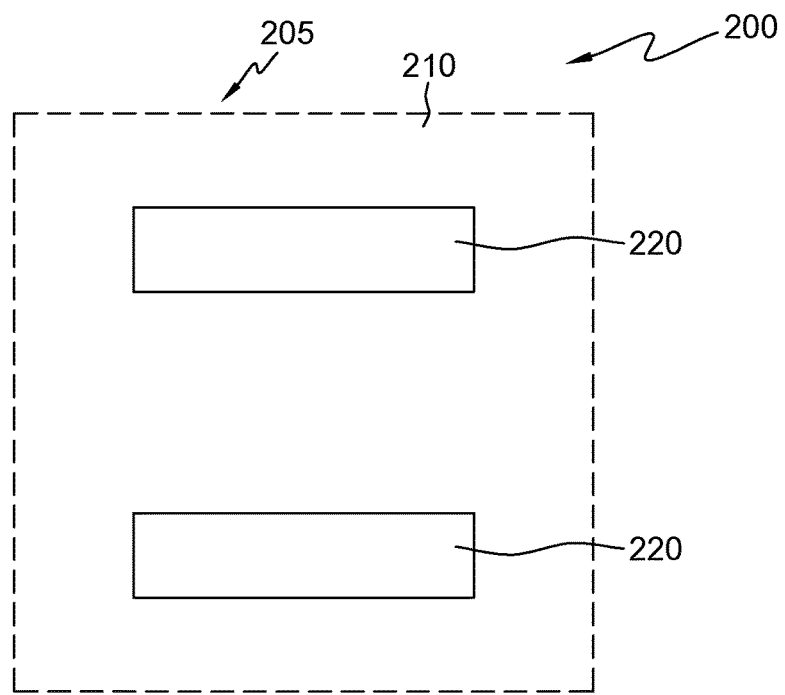

FIG. 2A depicts a structure 200 during fabrication. Structure 200 includes a gate mask layer 210 disposed over a substrate 205 (not visible in FIG. 2A) and a first gate pattern 220 formed in a first gate patterning layer 220. The first gate patterning layer 220 may include, for example, a silicon nitride masking material. FIG. 2B depicts structure 200 with a first etch pattern 230 formed in a first etch pattern layer 230 provided over the first gate patterning layer 220. First etch pattern layer 230 may include, for example, a silicon hydroxide masking material. FIG. 2C depicts structure 200 following etching of the first gate pattern 220 in first gate pattern layer 220 according to first etch pattern 230. As FIG. 2C depicts, etching of the first gate pattern 220 may include the first etching of rounded corner portions of first gate pattern 220.

Figure 2D:
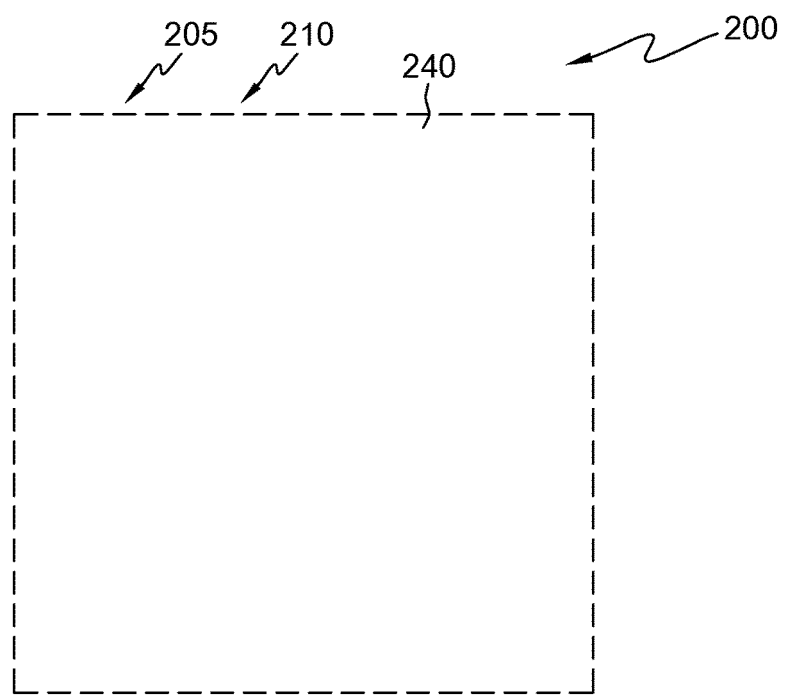

FIG. 2D depicts structure 200 with an intermediate layer 240 provided over first gate pattern 220 (not visible in FIG. 2D), gate mask layer 210, and substrate 205. Intermediate layer 240 may include, for example, an SOH material layer. Intermediate layer 240 may additionally protect first gate pattern 220 from subsequent etch processes.

Figure 2E:
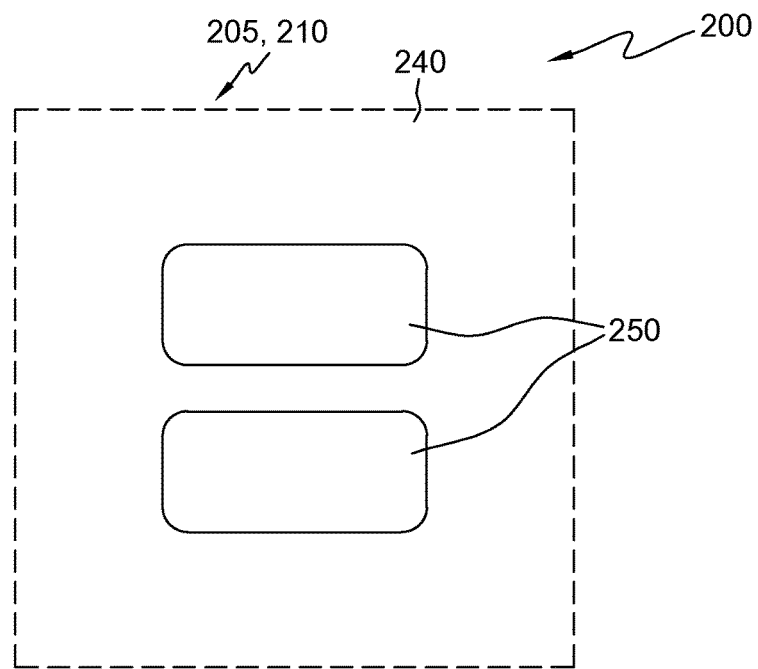
Figure 2F:
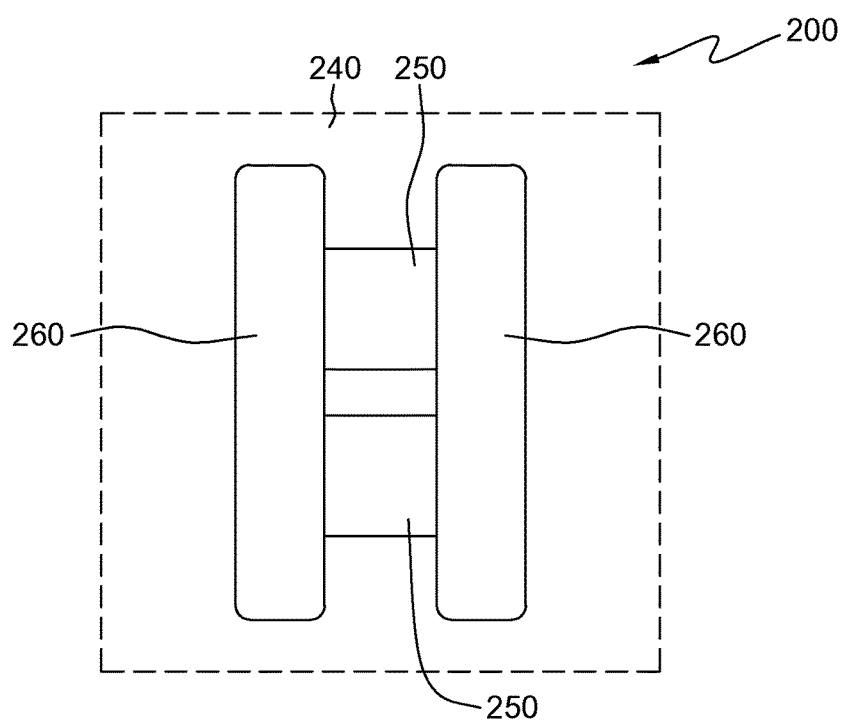

FIG. 2E depicts structure 200 with a second gate pattern 250 formed in a second gate patterning layer 250. Second gate patterning layer 250 may include, for example, a silicon nitride masking material. Although not visible in FIG. 2E, as depicted in following figures, the second gate patterning layer 250 may be provided to at least partially overlap first gate pattern 220. FIG. 2F depicts structure 200 with a second etch pattern 260 formed in a second etch pattern layer 260 provided over the second gate patterning layer 250. Second etch pattern layer 260 may include, for example, a silicon hydroxide masking material.

Figure 2G:
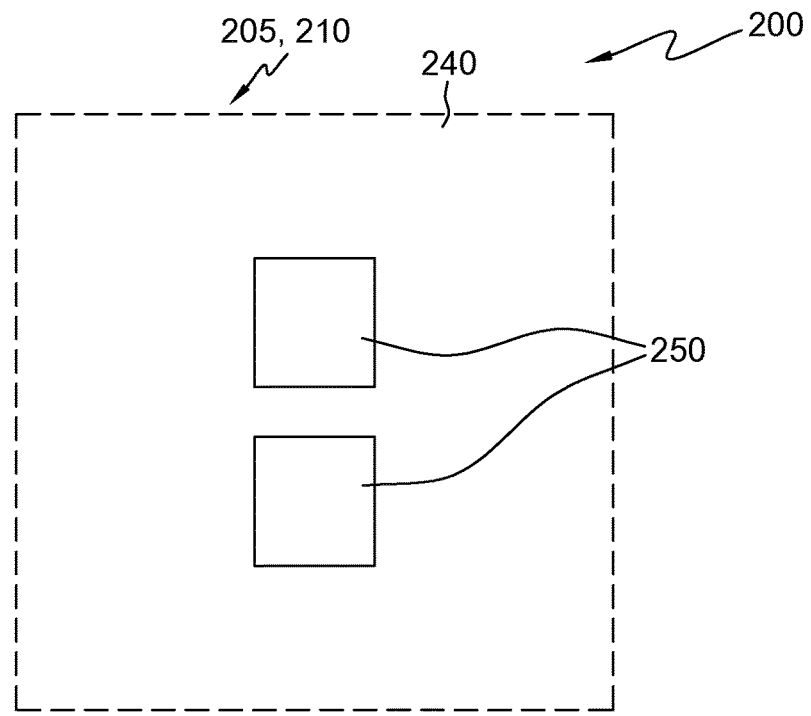

FIG. 2G depicts structure 200 following etching of the second gate pattern 250 in second gate pattern layer 250 according to second etch pattern 260. As FIG. 2G depicts, etching of the second gate pattern 250 may include the second etching of rounded corner portions of second gate pattern 250. Second gate pattern layer 250 may, in some embodiments, protect first gate pattern 220 from being further etched by the second etching of the rounded corner portions of second gate pattern 250.

Figure 2H:
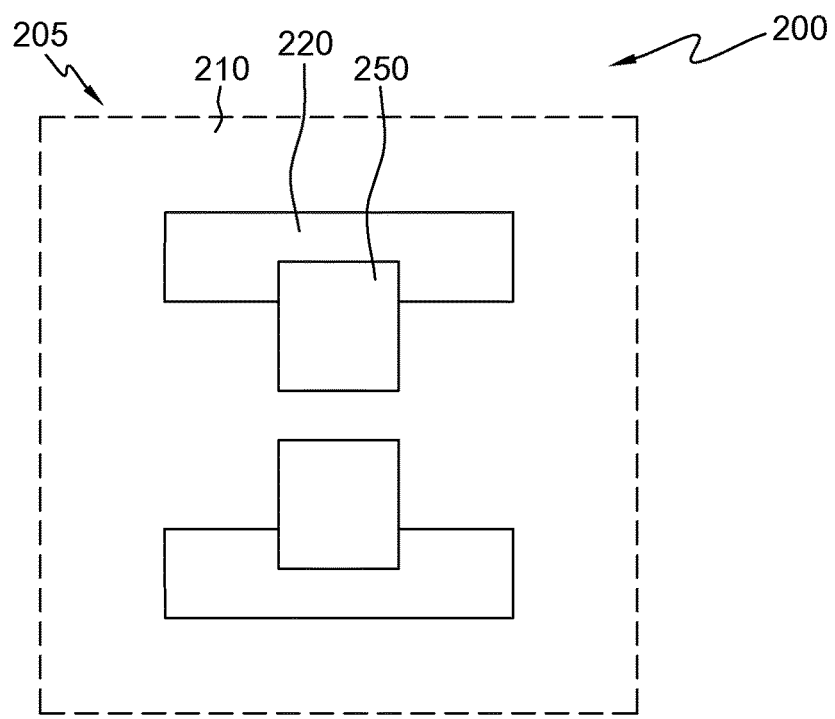
Figure 2I:
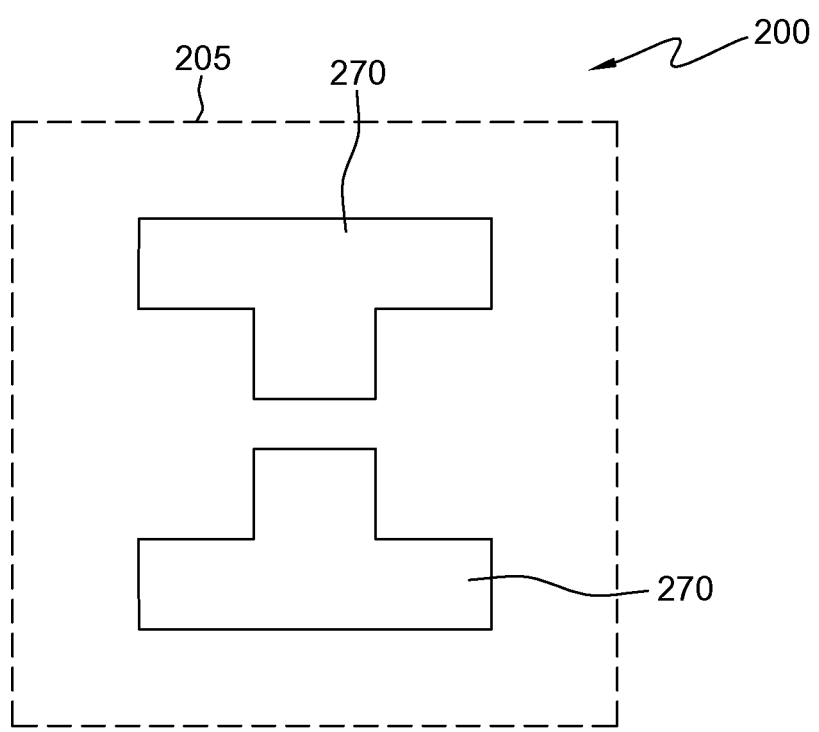

FIG. 2H depicts structure 200 with a portion of layer 240 removed, exposing first gate pattern 220 and second gate pattern 250 at least partially overlapping first gate pattern 220. FIG. 2I depicts structure 200 following etching of gate mask layer 210 using the first gate pattern and second gate pattern to form gate structure 270 over substrate 205. As also illustrated by FIGS. 2H and 2I, the second gate pattern 250 overlapping first gate pattern 220 may produce at least one inner corner portion of gate structure 270. Inner corner portions, as defined previously, may be corners defined by an intersection of two differently sized rectangular portions of gate structure 270. The at least one inner corner portion of gate structure 270 may have a corner rounding radius r of about 30 nm or less. Further, the inner corner rounding radius of the at least one inner corner of gate structure 270 may be about 0 nm, as illustrated by the exemplary gate structure 270 in FIG. 2I.

Figure 3A:
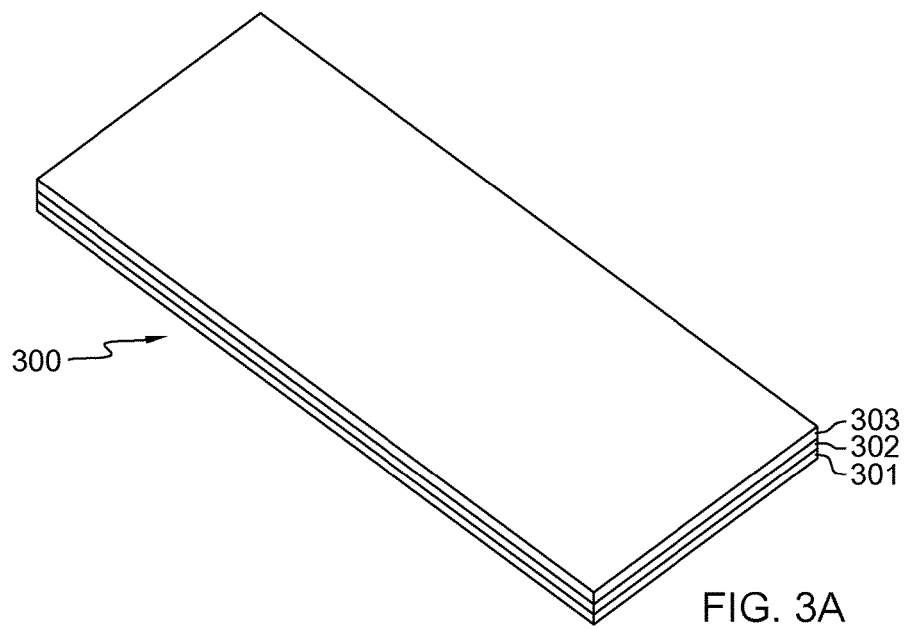
FIGS. 3A-3Z depict another example of an embodiment of a process for forming a gate structure of a circuit structure, in accordance with one or more aspects of the present invention.
Figure 3B:
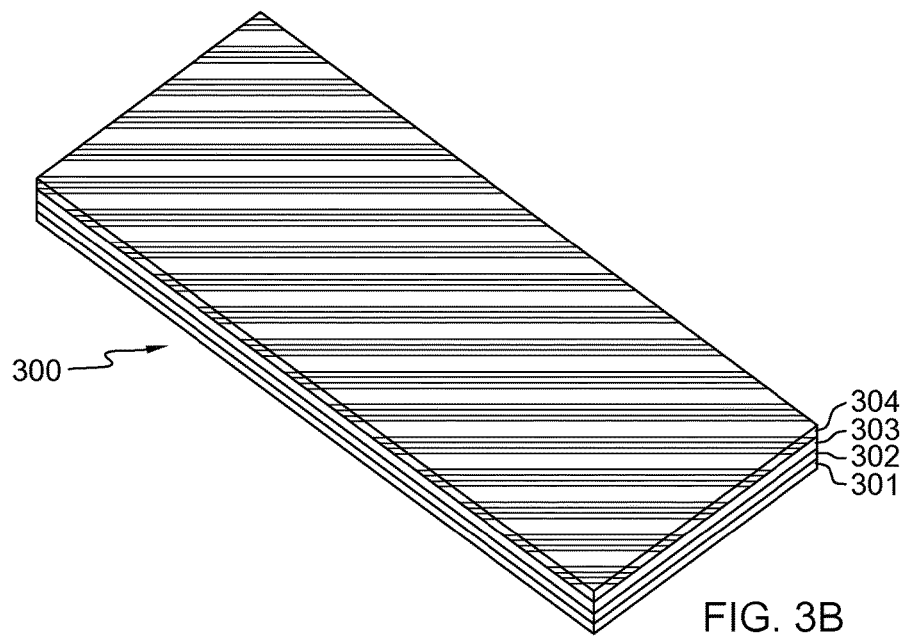
Figure 3C:
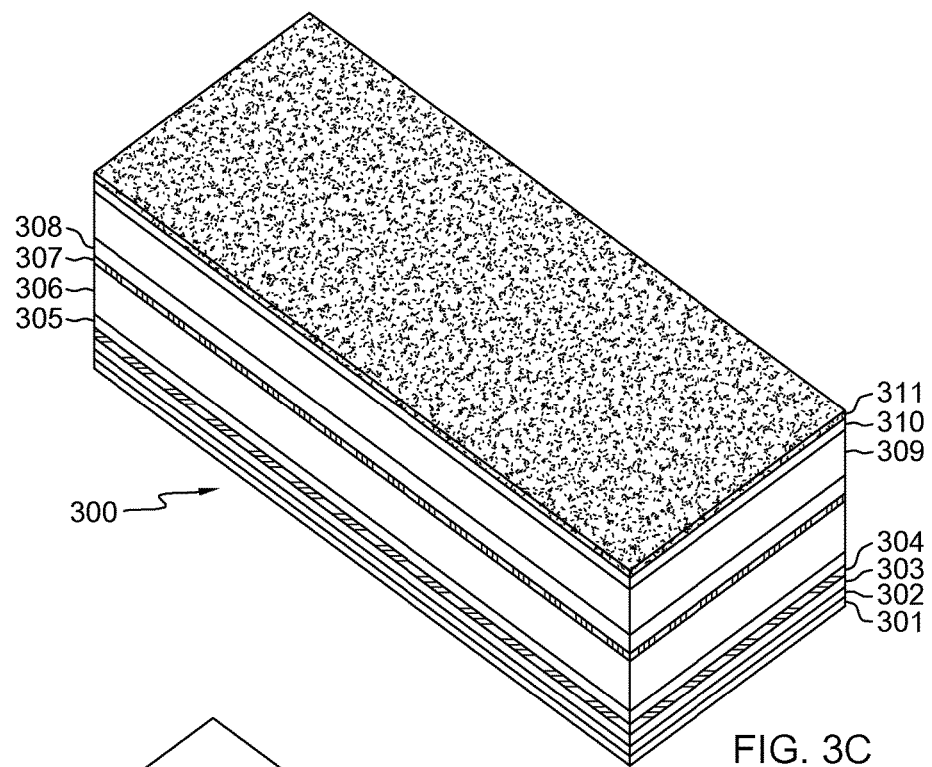
Figure 3D:
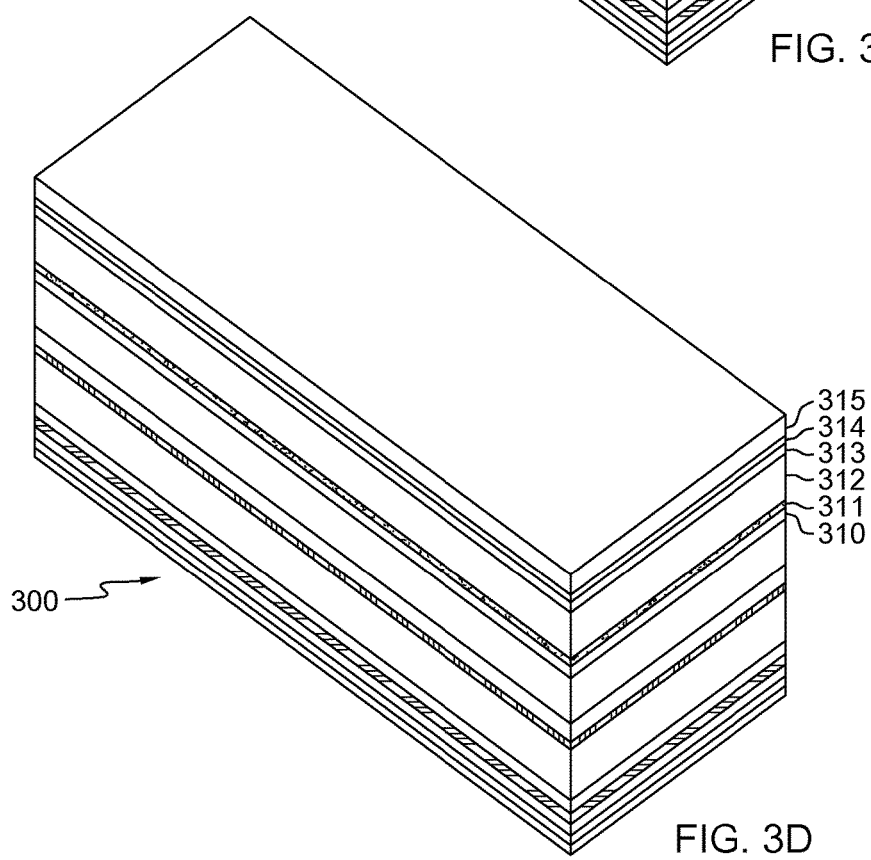
Figure 3E:
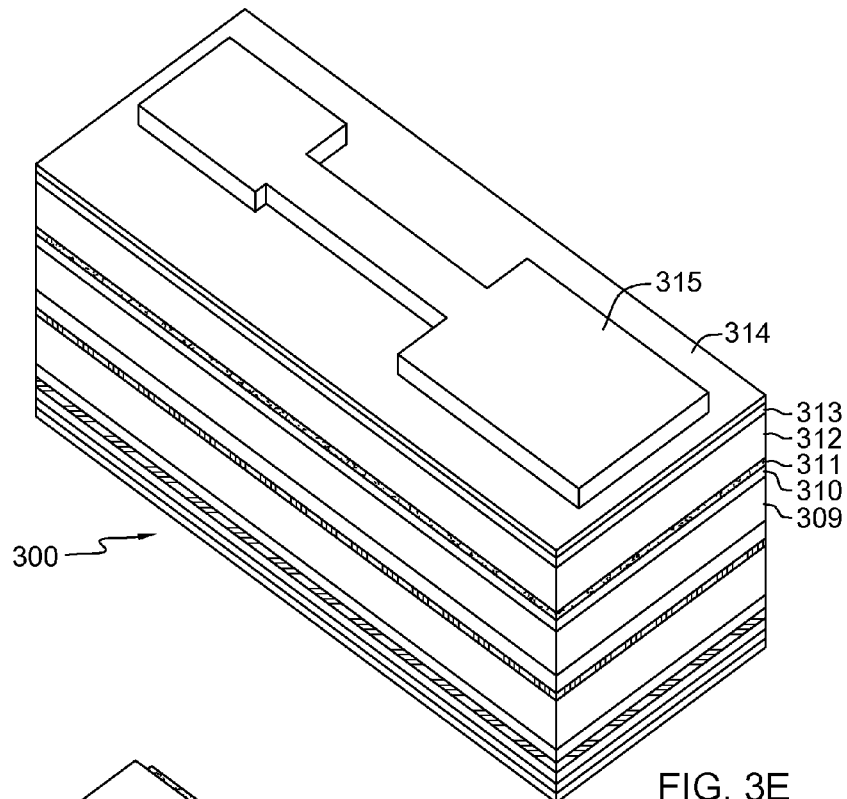
Figure 3F:
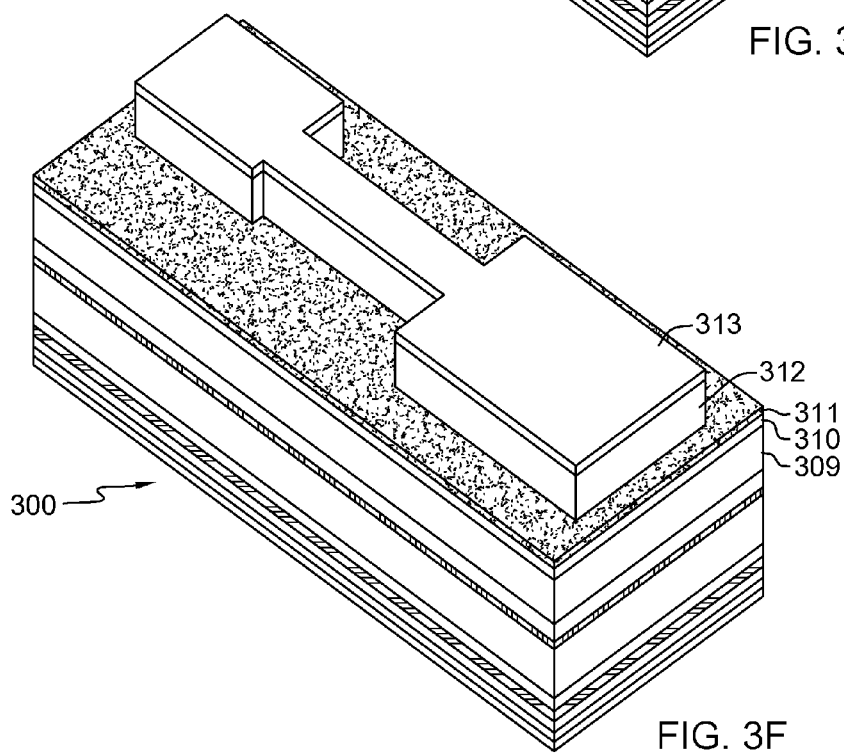
Figure 3G:
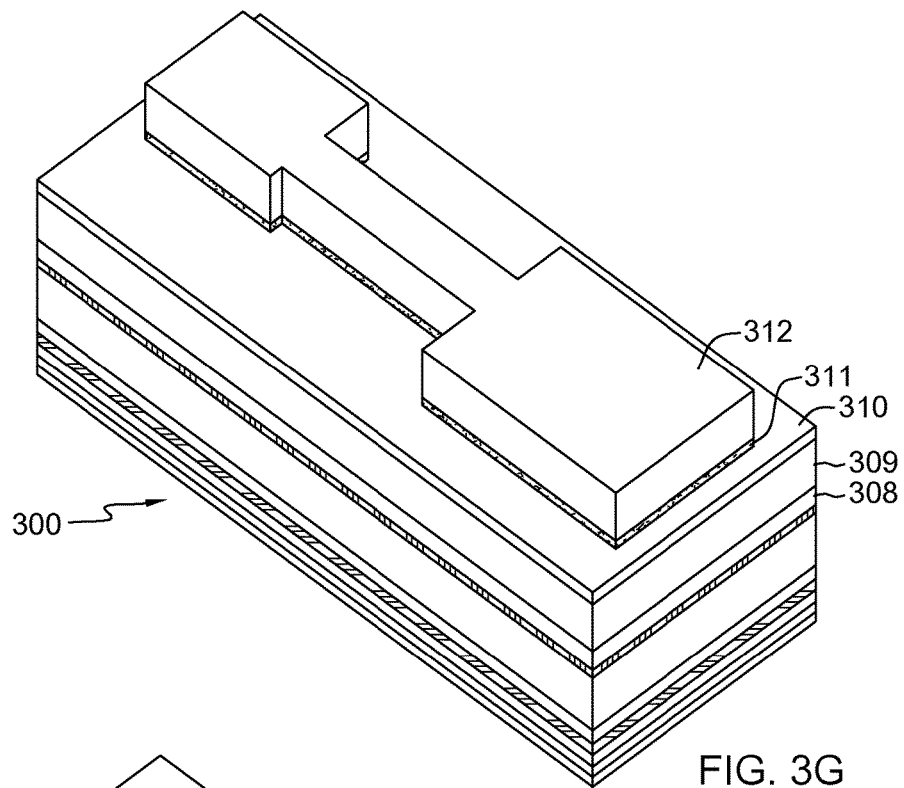
Figure 3H:
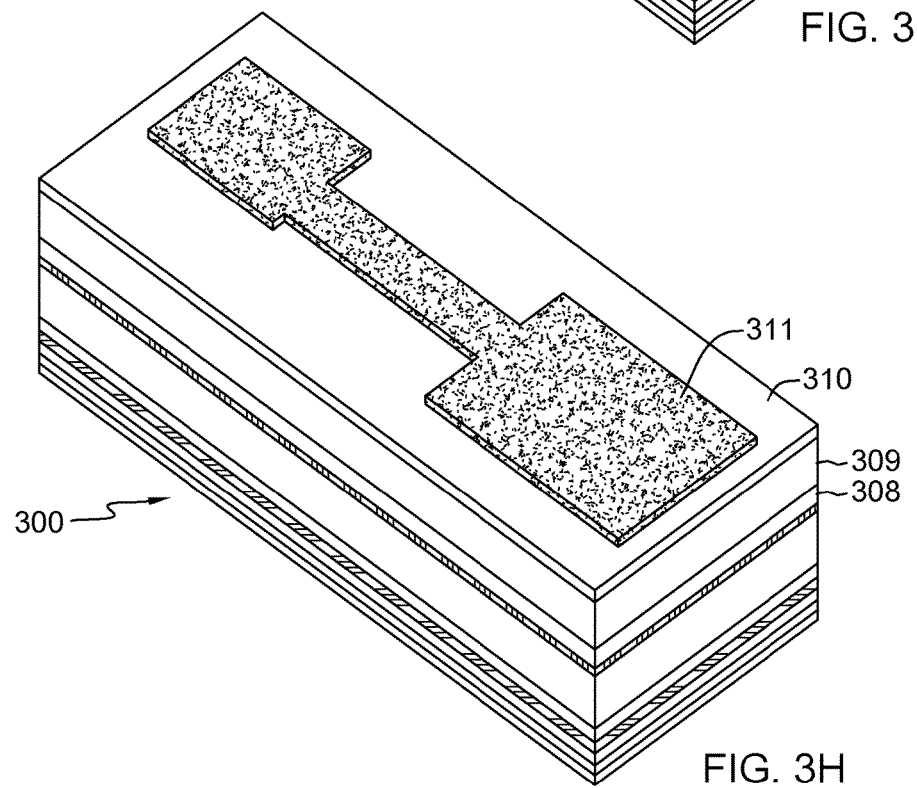
Figure 3I:
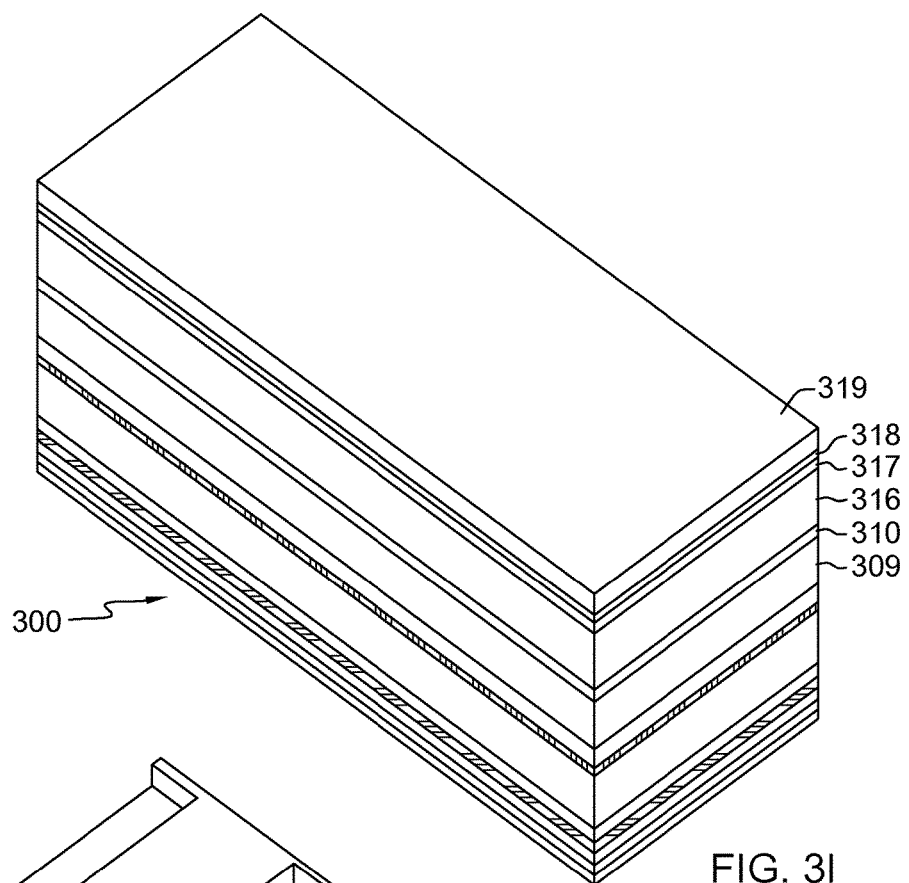
Figure 3J:
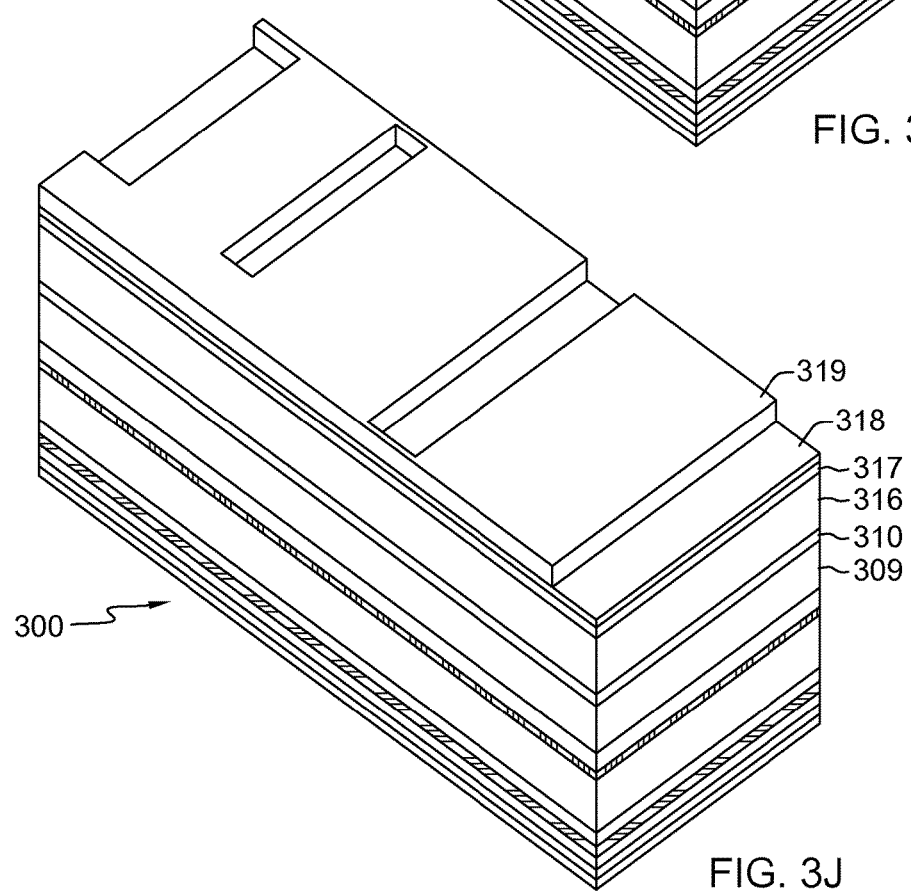
Figure 3K:
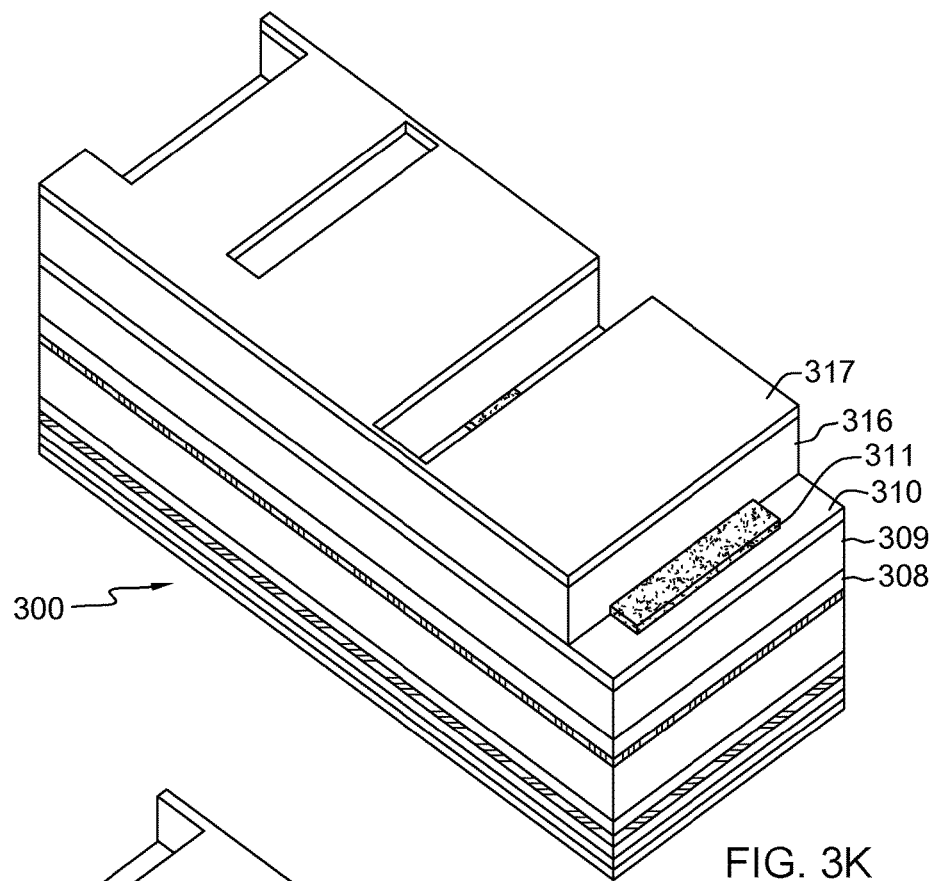
Figure 3L:
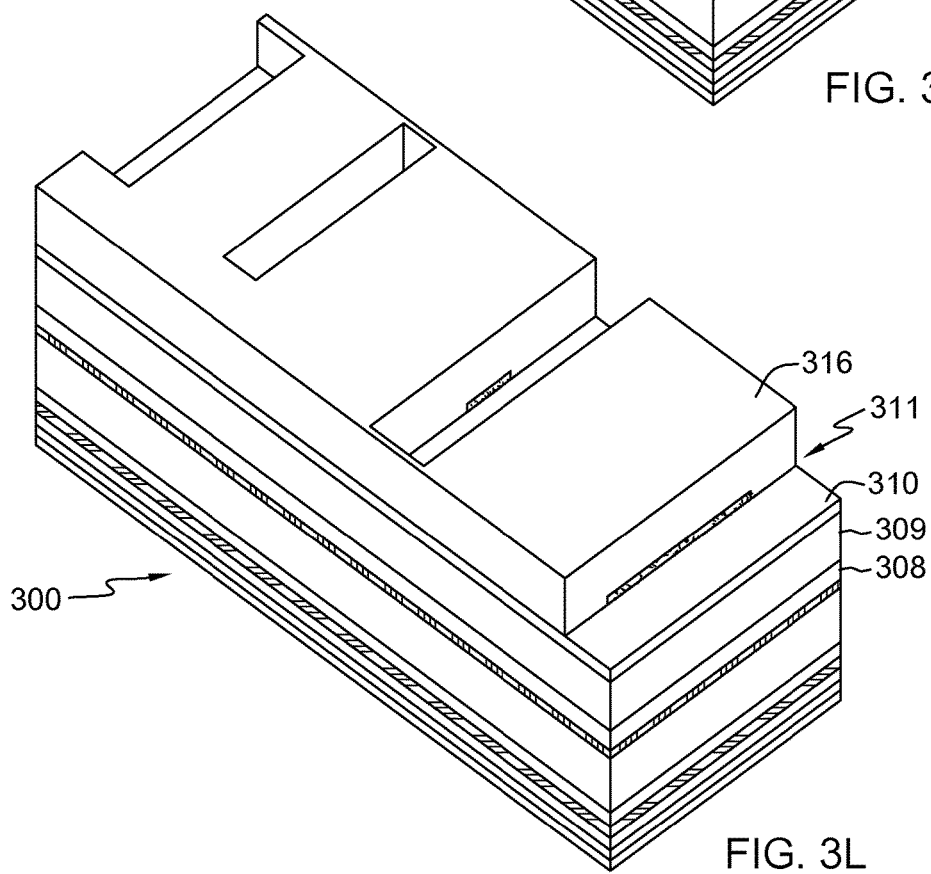
Figure 3M:
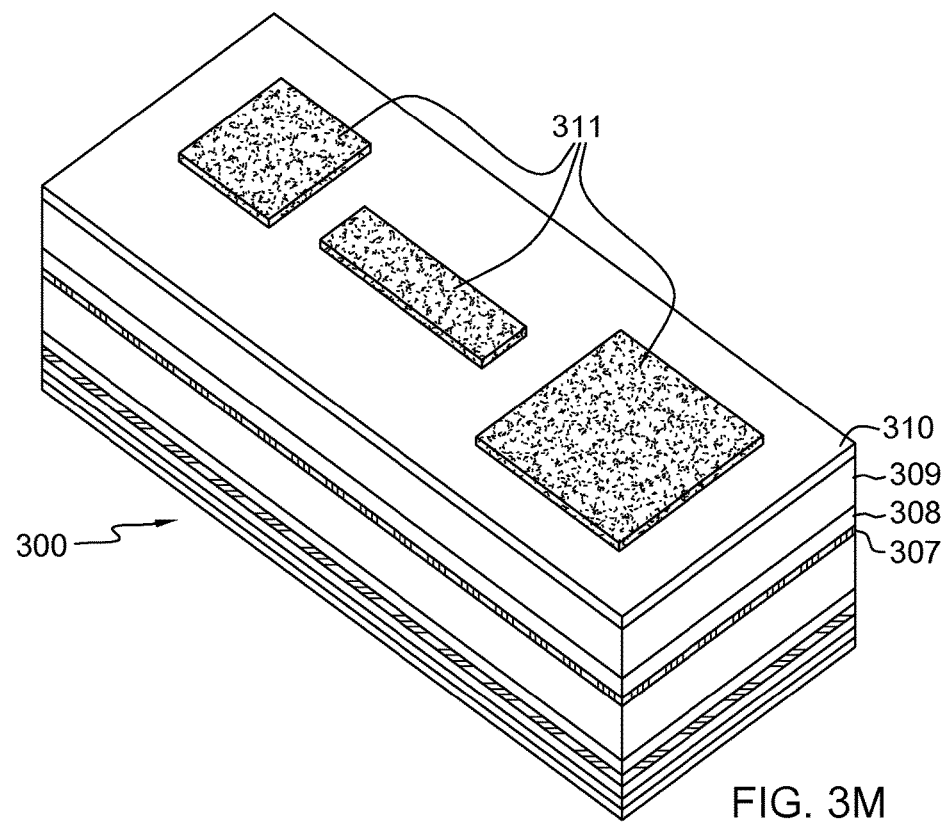
Figure 3N:
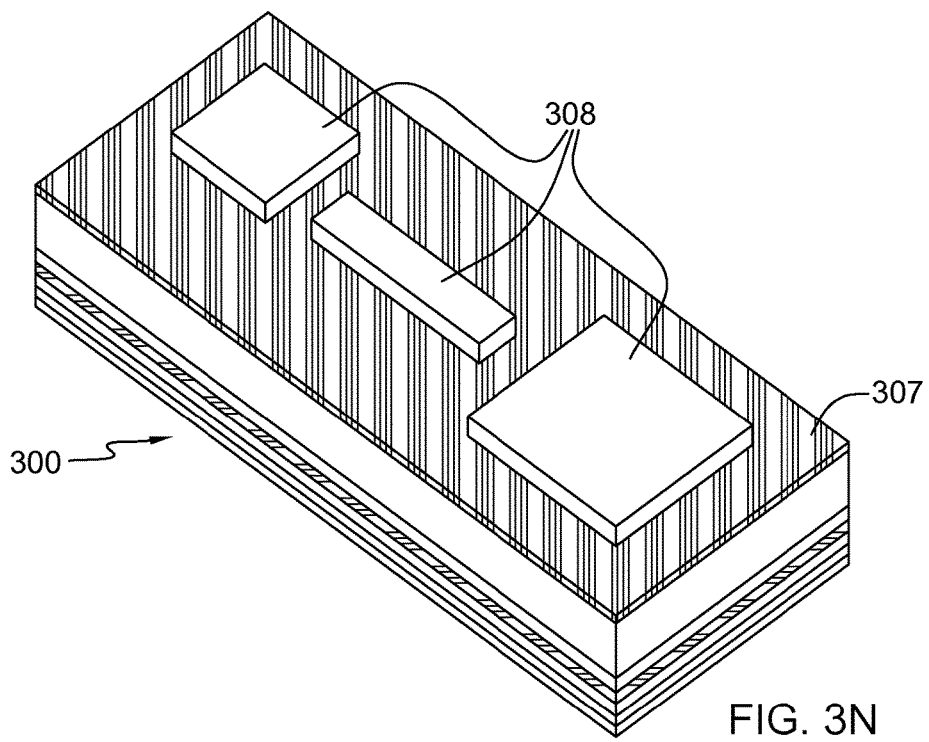
Figure 3O:
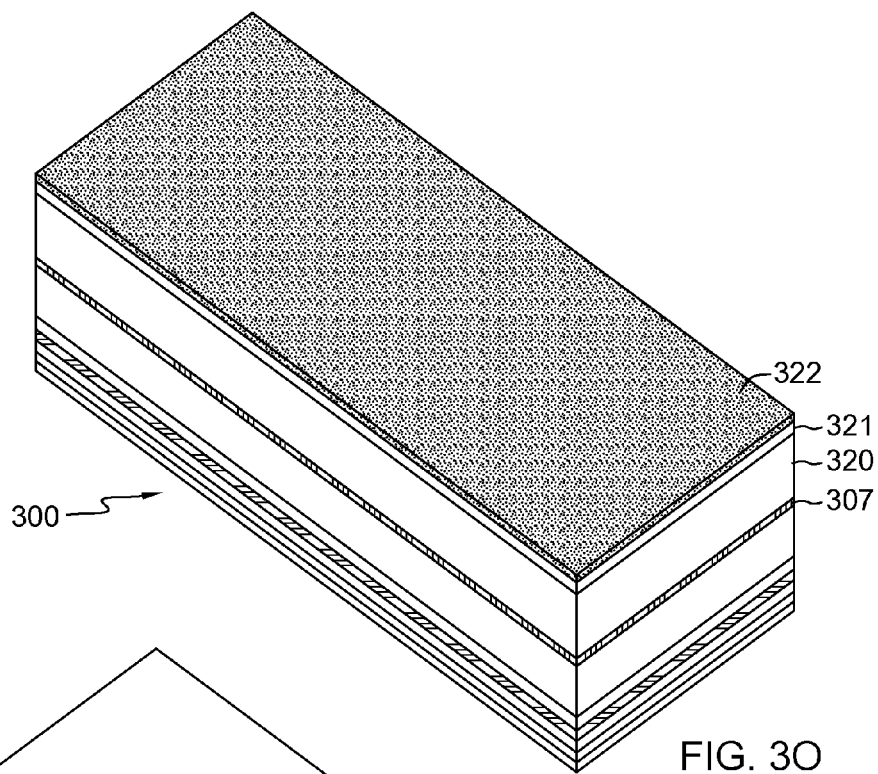
Figure 3P:
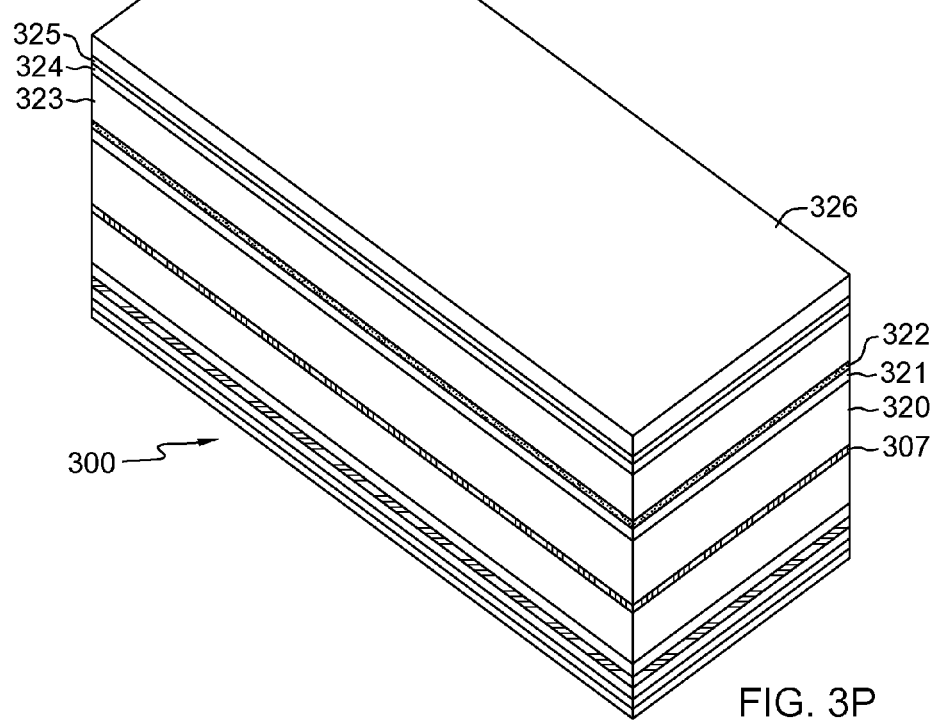
Figure 3Q:
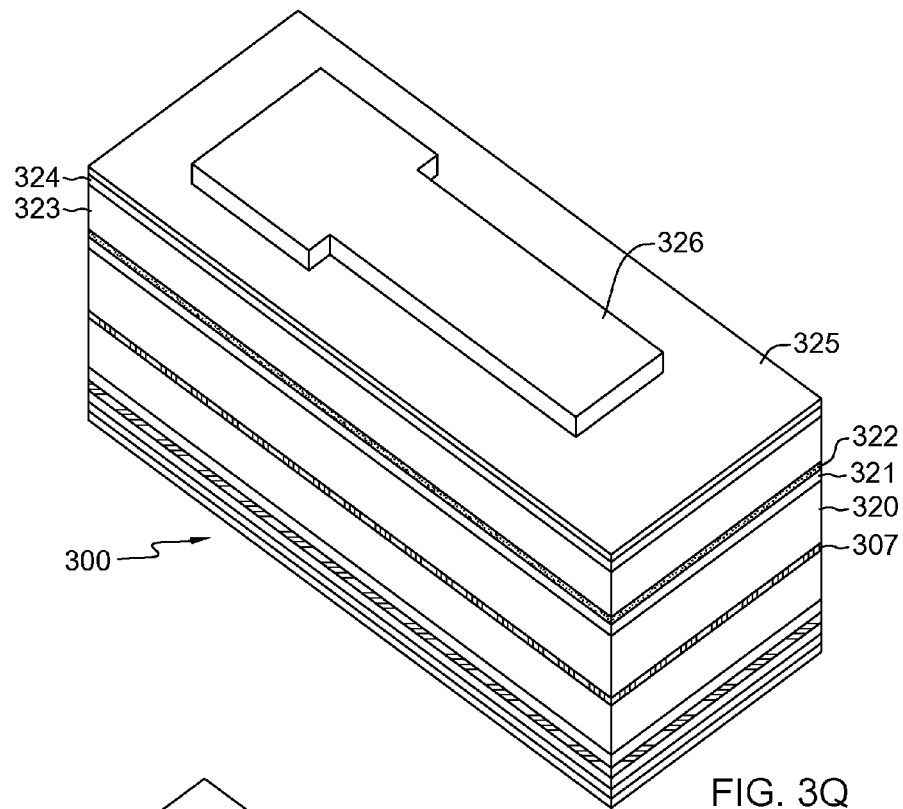
Figure 3R:
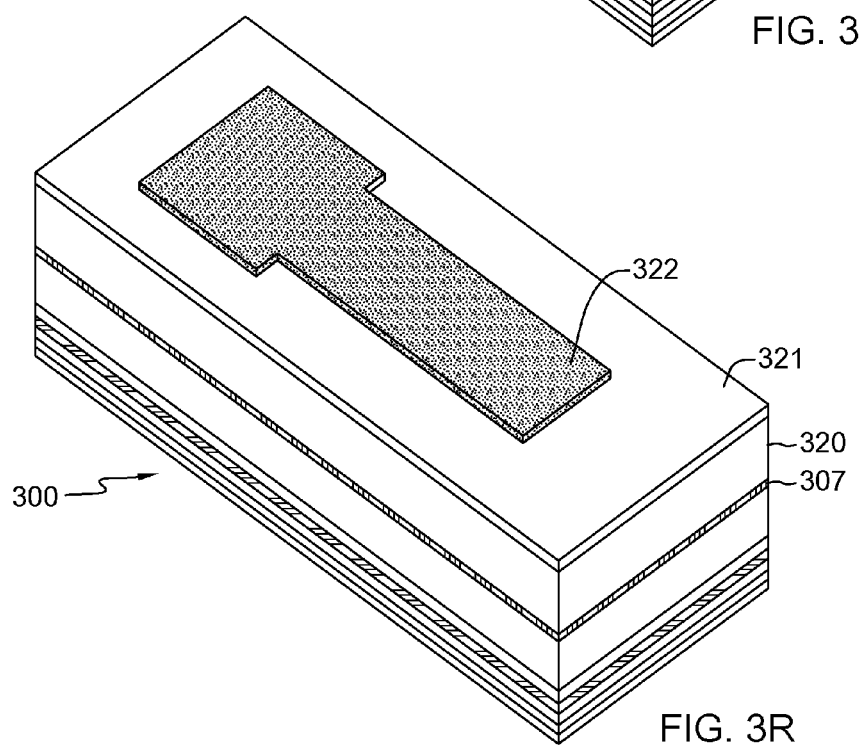
Figure 3S:
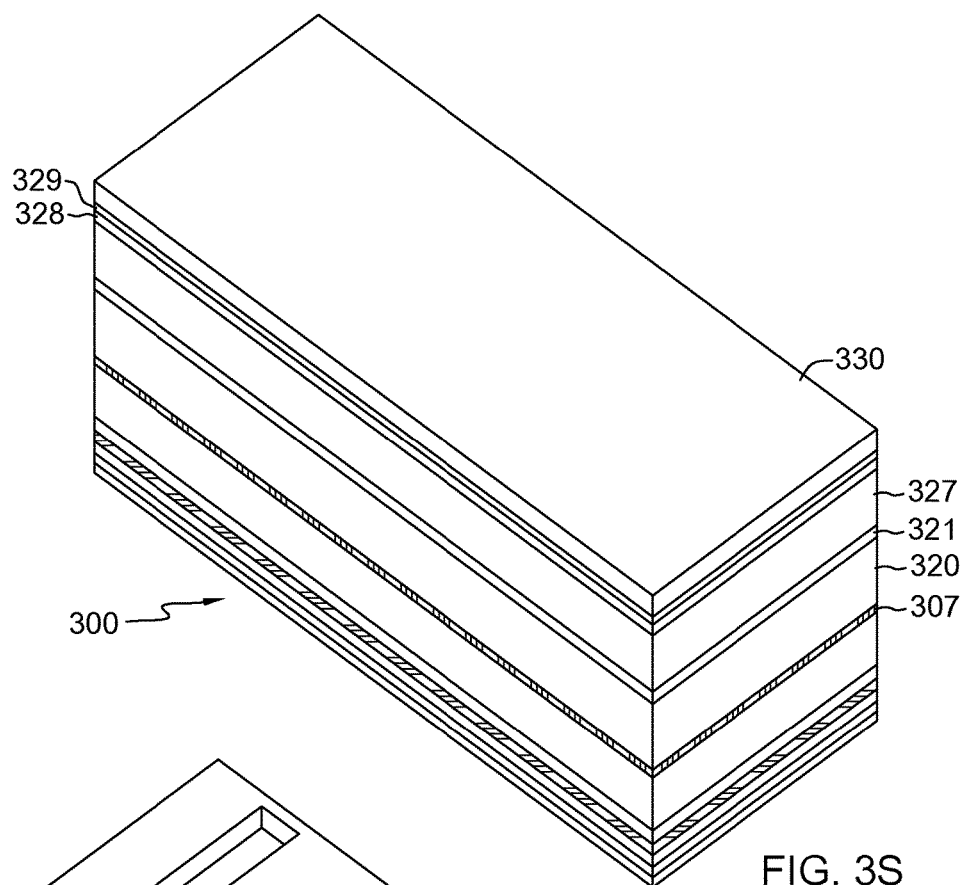
Figure 3T:
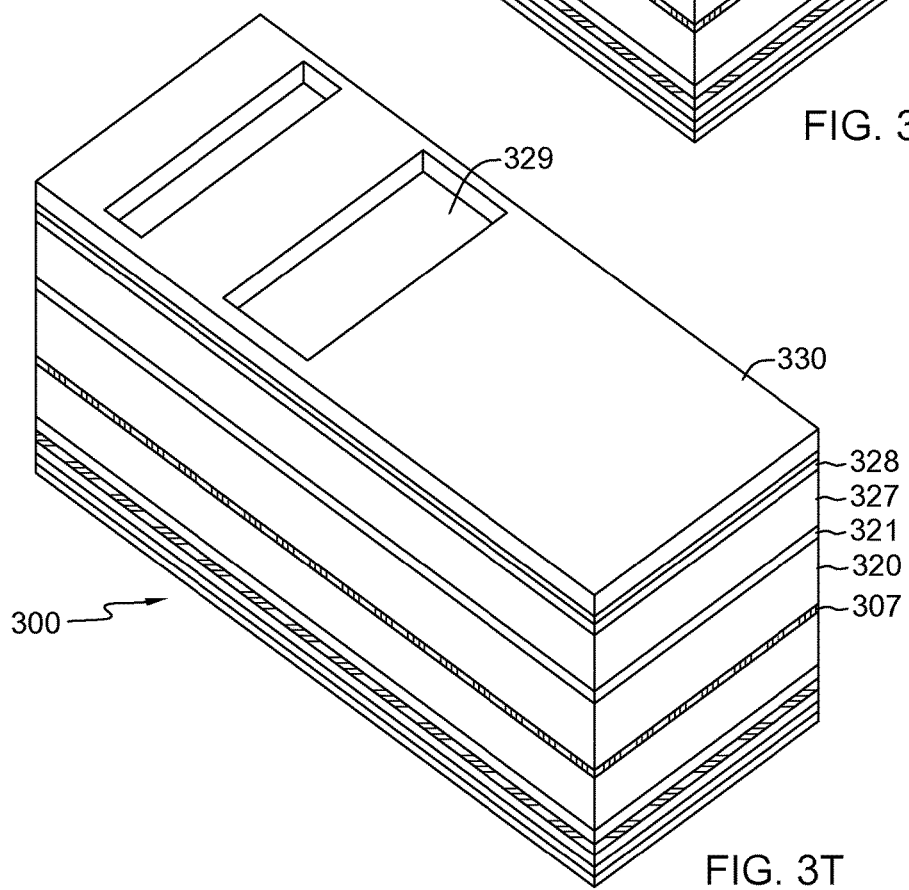
Figure 3U:
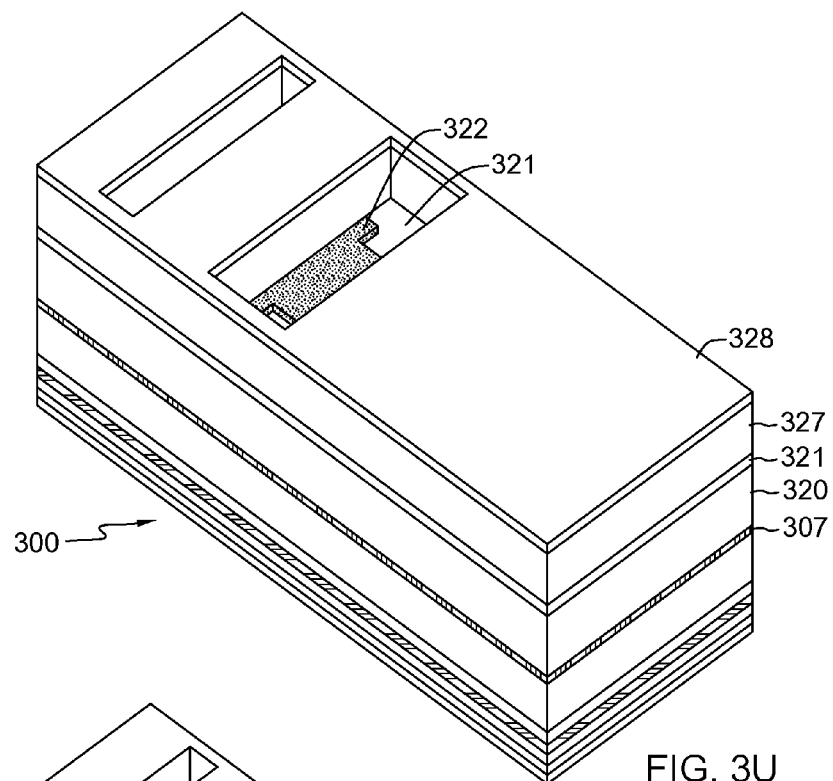
Figure 3V:
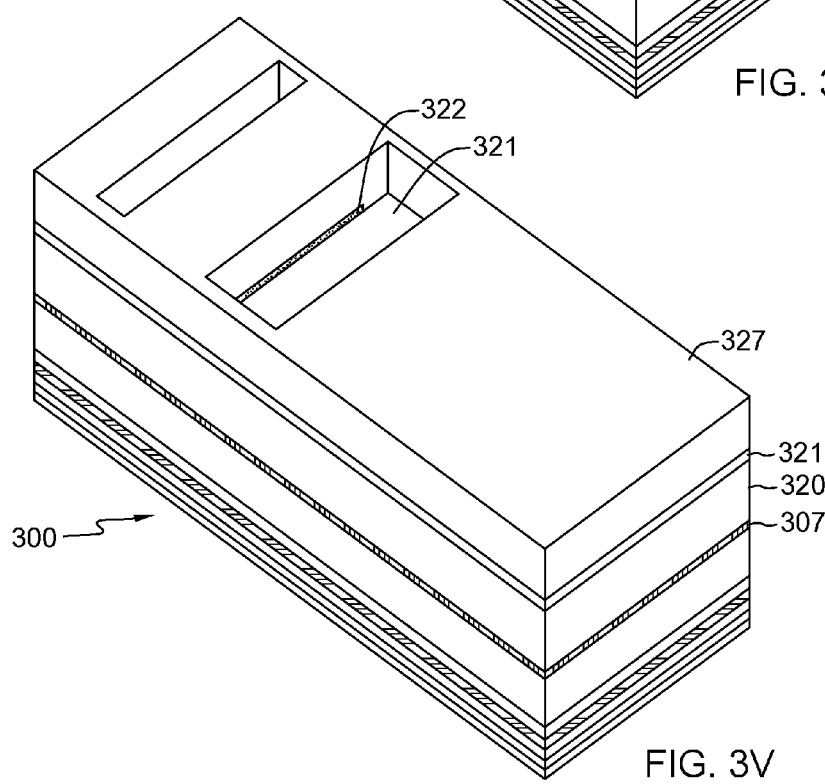
Figure 3W:
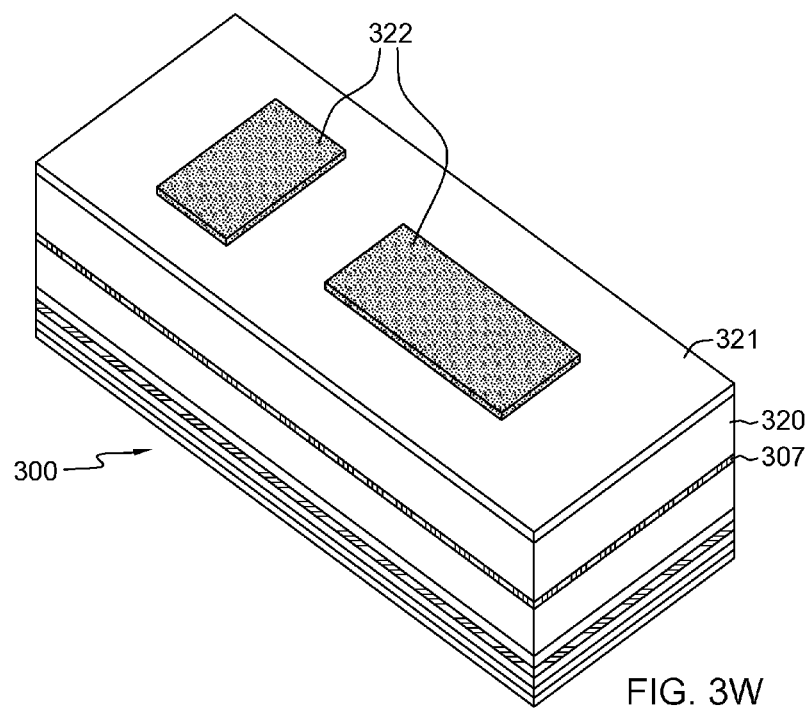
Figure 3X:
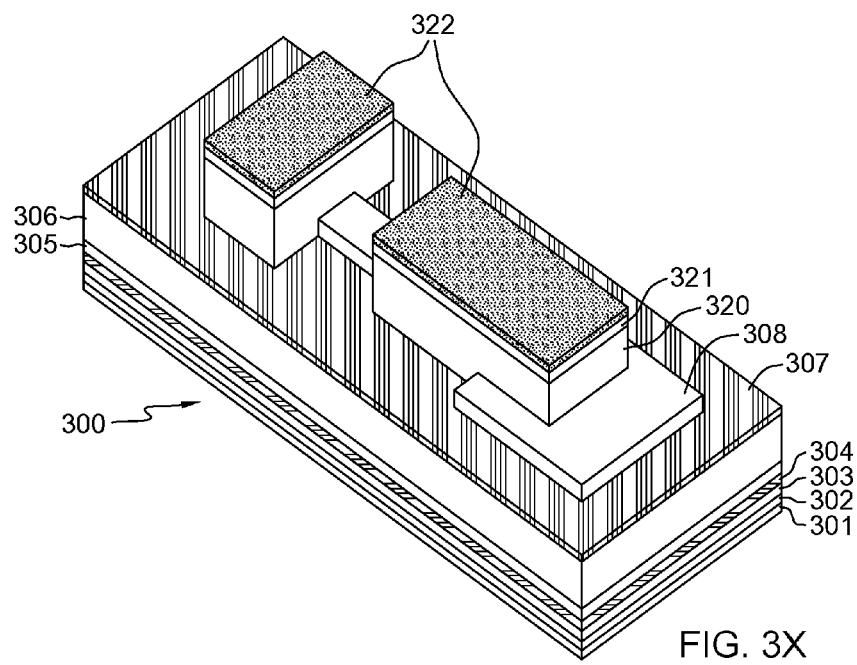
Figure 3Y:
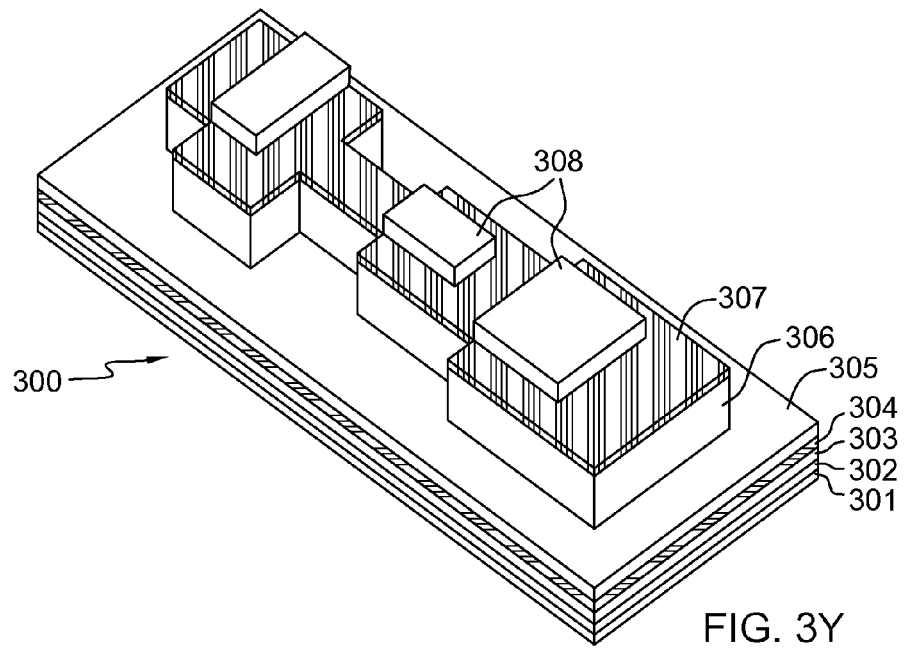
Figure 3Z:
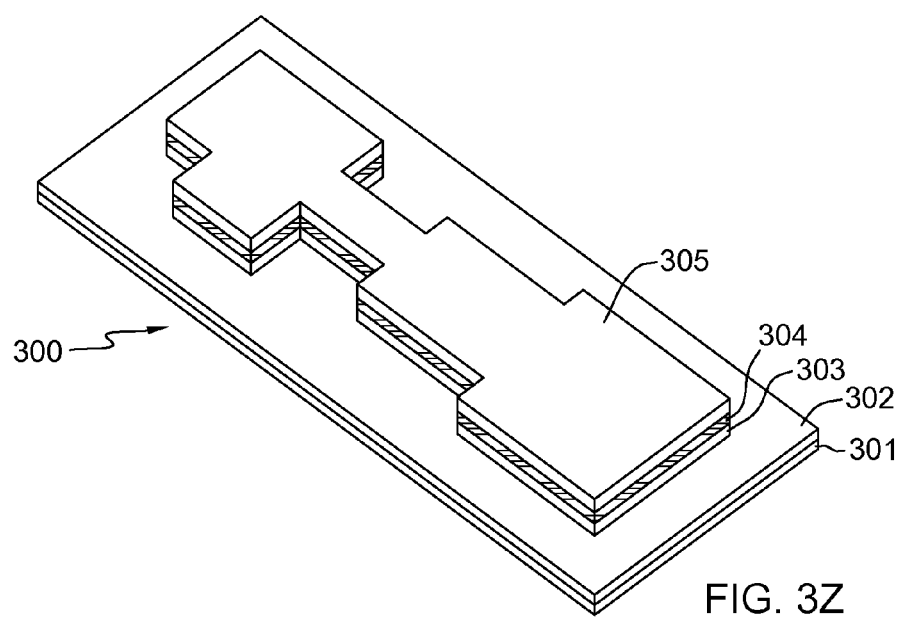

FIGS. 3A-3Z depict another example of the process described above and depicted in the block diagram of FIG. 1, providing a more detailed description of processing steps that may be included in forming a gate structure of a circuit structure. The resulting gate structure formed in the example of FIGS. 3A-3Z is also provided by way of example only, and it will be understood that many other gate structures may alternatively be formed by similar processes as those depicted in FIGS. 3A-3Z.

FIG. 3A depicts a structure 300 that may be part of a circuit structure over which a gate structure is to be formed. The exemplary structure 300 depicted may include a substrate 301, such as a silicon wafer, a first insulating layer 302, such as a silicon nitride layer, and a metal oxide layer 303. FIG. 3B depicts structure 300 with a gate layer 304 provided over metal oxide layer 303, such as an amorphous silicon gate layer 304. Gate layer 304, together with first insulating layer 302 and metal oxide layer 303, may be the layer or layers in which a gate structure is to be formed and that may be etched using a first gate pattern and second gate pattern, as described above and as further described below. It may be understood that substrate 301 may include already-formed transistor features, such as fins of a FinFET transistor, over which the gate structure is to be formed. It may also be understood that the exemplary materials of each layer of structure 300 depicted in FIGS. 3A-3B, as well as subsequent figures, are provided by way of example only, and alternative materials may be equivalently substituted in the processes described herein.

FIG. 3C depicts structure 300 of FIG. 3B with additional layers provided over gate layer 304 to set up a gate mask layer 307 and a first gate patterning layer 311 over gate mask layer 307. The layers may include a second insulating layer 305, such as an oxide layer, a first intermediate layer 306 such as a first SOH layer, gate mask layer 307, a first oxide hard mask layer 308 over gate mask layer 307, a second intermediate layer 309 such as a second SOH layer, a second oxide hard mask layer 310 and a first gate patterning layer 311. Gate mask layer 307 may include, for example, an amorphous silicon hard mask layer. First gate patterning layer 311 may be, for example, a silicon nitride hard mask layer.

FIG. 3D depicts structure 300 of FIG. 3C with additional layers provided over first gate patterning layer 311 to set up a first patterned resist that may be used to pattern first gate patterning layer 311. The layers may include a third intermediate layer 312, such as an SOH layer, a first oxynitride layer 313 such as silicon oxynitride (SiON), a first bottom anti-reflective coating (BARC) layer 314, and a first resist layer 315. FIG. 3E depicts structure 300 following etching of first resist layer 315 to form the first patterned resist. The first patterned resist 315 may correspond to a desired pattern for the first gate pattern, prior to a first etching of the first gate pattern to etch corner portions of the first gate pattern.

FIG. 3F depicts structure 300 of FIG. 3E etching of oxynitride layer 313 and third intermediate layer 312 according to first patterned resist 315, along with removal of first BARC layer 314 and first patterned resist 315. FIG. 3G depicts structure 300 following etching of first gate patterning layer 311 to form first gate pattern 311 over gate mask layer 307. FIG. 3H depicts structure 300 following removal of third intermediate layer 312, leaving first gate pattern 311 over gate mask layer 307.

FIG. 3I depicts structure 300 of FIG. 3H with additional layers provided over first gate pattern layer 311 to set up a first etch pattern layer and second patterned resist to form a first etch pattern that may be used to perform the first etching of rounded corner portions of first gate pattern 311. The additional layers may include, for example, a fourth intermediate layer 316, such as an SOH layer, a first etch pattern layer 317 such as a silicon oxynitride (SiON) layer, a second bottom anti-reflective coating (BARC) layer 318, and a second resist layer 319. FIG. 3J depicts structure 300 following etching of second resist layer 319 to form the first etch pattern in second resist layer 319. The first etch pattern 319 may correspond, in part, to portions of the first gate pattern 311 (not visible in FIG. 3J) that are to be etched to remove rounded corner portions of first gate pattern 311.

FIG. 3K depicts structure 300 following an etching of the first etch pattern, into first etch pattern layer 317 and fourth intermediate layer 316, as well as following removal of second BARC layer 318 and second resist layer 319. As FIG. 3K depicts, etching of the first etch pattern into first etch pattern layer 317 exposes portions of first gate pattern 311. Exposure of portions of first gate pattern 311 allows for etching of first gate pattern 311 according to first etch pattern 317, as depicted in FIG. 3L. As FIG. 3L illustrates, the etching of first gate pattern 311 according to first etch pattern 317 may include the first etching of rounded corner portions of first gate pattern 311. FIG. 3M depicts the structure 300 of FIG. 3L following removal of all layers over first gate pattern 311. FIG. 3N depicts structure 300 following etching of first oxide hard mask layer 308, second intermediate layer 309, and second oxide hard mask layer 310 according to first gate pattern 311. As FIG. 3N illustrates, a portion of first oxide hard mask layer 308 corresponding to first gate pattern 311 remains over gate mask layer 307.

FIG. 3O depicts structure 300 of FIG. 3N with additional layers provided over gate mask layer 307 and first oxide hard mask layer 308 (not visible in FIG. 3O) to set up a second gate patterning layer 322. The layers may include a fifth intermediate layer 320, such as a SOH layer, a third oxide hard mask layer 321 and a second gate patterning layer 322. Second gate patterning layer 322 may be, for example, a silicon nitride hard mask layer.

FIG. 3P depicts structure 300 of FIG. 3O with additional layers provided over second gate patterning layer 322 to set up a second patterned resist that may be used to pattern second gate patterning layer 322. The layers may include a sixth intermediate layer 323, such as an SOH layer, a second oxynitride layer 324 such as silicon oxynitride (SiON), a third bottom anti-reflective coating (BARC) layer 325, and a third resist layer 326. FIG. 3Q depicts structure 300 following etching of third resist layer 326 to form the third patterned resist 326. The third patterned resist 326 may correspond to a desired pattern for the second gate pattern, prior to a second etching of the second gate pattern to etch corner portions of the second gate pattern. FIG. 3R depicts structure 300 of FIG. 3Q etching of oxynitride layer 324 and sixth intermediate layer 323 according to third patterned resist 326, along with removal of third BARC layer 325 and third patterned resist 326, to form second gate pattern 322 in second gate pattern layer 322.

FIG. 3S depicts structure 300 of FIG. 3R with additional layers provided over second gate pattern layer 322 to set up a second etch pattern layer and fourth patterned resist to form a second etch pattern that may be used to perform the second etching of rounded corner portions of second gate pattern 322. The additional layers may include, for example, a seventh intermediate layer 327, such as an SOH layer, a second etch pattern layer 328 such as a silicon oxynitride (SiON) layer, a fourth bottom anti-reflective coating (BARC) layer 329, and a fourth resist layer 330. FIG. 3T depicts structure 300 following etching of fourth resist layer 330 to form the second etch pattern in fourth resist layer 330. The second etch pattern may correspond, in part, to portions of the second gate pattern 322 (not visible in FIG. 3T) that are to be etched to remove rounded corner portions of second gate pattern 322.

FIG. 3U depicts structure 300 following an etching of the second etch pattern into second etch pattern layer 328 and seventh intermediate layer 327, as well as following removal of fourth BARC layer 329 and fourth resist layer 330. As FIG. 3U depicts, etching of the second etch pattern into second etch pattern layer 328 exposes portions of second gate pattern 322. Exposure of portions of second gate pattern 322 allows for etching of second gate pattern 322 according to second etch pattern 328, as depicted in FIG. 3V. As FIG. 3V illustrates, the etching of second gate pattern 322 according to second etch pattern 328 may include the second etching of rounded corner portions of the second gate pattern 322. FIG. 3W depicts the structure 300 of FIG. 3V following removal of all layers over second gate pattern 322.

FIG. 3X depicts structure 300 of FIG. 3W following etching and removal of portions of fifth intermediate layer 320 and third oxide hard mask layer 321 according to second gate pattern 322 to expose gate mask layer 307 and at least a portion of first gate pattern 308. As FIG. 3X illustrates, second gate pattern 322 overlaps at least a portion of first gate pattern 308, and as shown in FIGS. 3Y and 3Z, the first gate pattern 308 and second gate pattern 322 overlapping first gate pattern 308 together may be used to form the desired gate structure. FIG. 3Y depicts structure 300 of FIG. 3X following an etching of gate mask layer 307, as well as first intermediate layer 306, to expose second insulating layer 305. FIG. 3Y also depicts structure 300 following removal of second gate pattern 322, oxide hard mask layer 321, and intermediate layer 320 following etching of gate mask layer 307. As FIG. 3Y illustrates, in some embodiments portions of first gate pattern 308 may be left following etching of gate mask layer 307 and removal of layers over first gate pattern 308, as the layers over first gate pattern 308 may partially block removal of some portions of first gate pattern 308.

FIG. 3Z depicts structure 300 of FIG. 3Y following etching of second insulating layer 305, gate layer 304, and metal oxide layer 303. Gate layer 304 and metal oxide layer 303 may define a gate structure for the circuit structure, and second insulating layer 305 may also be considered part of the gate structure for the circuit structure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

What is claimed is:

1. A method of forming a gate structure of a circuit structure comprising:
    forming a first gate pattern in a gate mask layer;
    forming a second gate pattern in the gate mask layer, the second gate pattern at least partially overlapping the first gate pattern;
    etching rounded inner corner portions of the first and second gate patterns; and
    etching the gate mask layer using the first gate pattern and second gate pattern to form the gate structure.

2. The method of claim 1, wherein the second gate pattern at least partially overlapping the first gate pattern produces at least one inner corner portion of the gate structure, the at least one corner portion having a corner rounding radius, the corner rounding radius being less than 30 nm.

3. The method of claim 1, wherein forming the first gate pattern further comprises:
    providing a first gate patterning layer over the gate mask layer;
    forming the first gate pattern in the first gate patterning layer;
    providing a first etch pattern layer over the first gate patterning layer;
    forming a first etch pattern in the first etch pattern layer;
    etching the first gate pattern according to the first etch pattern, the etching comprising the first etching of rounded corner portions of the first gate pattern.

4. The method of claim 1, wherein the gate mask layer comprises one or more of silicon nitride or amorphous silicon.

5. The method of claim 1, further comprising providing an intermediate layer over the first gate pattern prior to providing the second gate pattern, the intermediate layer preventing etching of the first gate pattern by subsequent etching.

6. The method of claim 2, wherein the corner rounding radius of the at least one corner portion is about 0 nm.

7. The method of claim 3, wherein forming the first gate pattern in the first gate patterning layer comprises providing a first patterned resist over the first gate patterning layer and etching the first gate patterning layer using the first patterned resist.

8. The method of claim 7, wherein providing the first patterned resist comprises providing a first resist layer over the first gate patterning layer and etching the first resist layer to form the first gate pattern in the first resist layer.

9. The method of claim 3, wherein the first gate patterning layer comprises a silicon nitride masking material.

10. The method of claim 3, wherein forming the first etch pattern in the first etch pattern layer comprises providing a second patterned resist over the first etch pattern layer and etching the first etch pattern layer using the second patterned resist.

11. The method of claim 9, wherein providing the second patterned resist comprises providing a second resist layer over the first etch pattern layer and etching the second resist layer to form the first etch pattern in the first etch pattern layer.

12. The method of claim 3, wherein the first etch pattern layer comprises a silicon hydroxide masking material.

13. The method of claim 3, wherein forming the second gate pattern further comprises:
    providing a second gate patterning layer over the gate mask layer and the first gate pattern;
    forming the second gate pattern in the second gate patterning layer;
    providing a second etch pattern layer over the second gate patterning layer;
    forming a second etch pattern in the second etch pattern layer; and,
    etching the second gate pattern in the second gate patterning layer according to the second etch pattern, the etching comprising the second etching of rounded corner portions of the second gate pattern.

14. The method of claim 13, wherein the second gate patterning layer prevents the first gate pattern from being further etched by the second etching of rounded corner portions of the second gate pattern.

15. The method of claim 13, wherein forming the second gate pattern in the second gate patterning layer comprises providing a third patterned resist over the second gate patterning layer and etching the second gate patterning layer using the third patterned resist.

16. The method of claim 15, wherein providing the third patterned resist comprises providing a third resist layer over the second gate patterning layer and etching the third resist layer to form the second gate pattern in the third resist layer.

17. The method of claim 13, wherein the second gate patterning layer comprises a silicon nitride masking material.

18. The method of claim 13, wherein forming the second etch pattern in the second etch pattern layer comprises providing a fourth patterned resist over the second etch pattern layer and etching the second etch pattern layer using the fourth patterned resist.

19. The method of claim 18, wherein providing the fourth patterned resist comprises providing a fourth resist layer over the second etch pattern layer and etching the fourth resist layer to form the second etch pattern in the second etch pattern layer.

20. The method of claim 13, wherein the first etch pattern layer comprises a silicon hydroxide masking material.

* * * * *